(12) United States Patent
Coleman

(10) Patent No.: US 8,436,662 B2
(45) Date of Patent: May 7, 2013

(54) JUNCTION GATE DRIVER WITH TAPPED INDUCTOR CURRENT SOURCE

(75) Inventor: Charles Coleman, Fort Collins, CO (US)

(73) Assignee: Microsemi Corporation, Aliso Viejo, CA (US)

( * ) Notice: Subject to any disclaimer, the term of this patent is extended or adjusted under 35 U.S.C. 154(b) by 47 days.

(21) Appl. No.: 13/104,809

(22) Filed: May 10, 2011

(65) Prior Publication Data

US 2011/0273208 A1 Nov. 10, 2011

Related U.S. Application Data

(60) Provisional application No. 61/333,157, filed on May 10, 2010.

(51) Int. Cl.
*H03B 1/00* (2006.01)
*H03K 3/00* (2006.01)

(52) U.S. Cl.
USPC .............................. 327/109; 327/108; 327/110

(58) Field of Classification Search .................. 327/108, 327/109, 110
See application file for complete search history.

(56) References Cited

U.S. PATENT DOCUMENTS

| 5,264,736 A * | 11/1993 | Jacobson ....................... 327/365 |
| 2006/0034114 A1 | 2/2006 | Omura |
| 2006/0186933 A1 | 8/2006 | Kimura et al. |
| 2007/0013356 A1* | 1/2007 | Qiu et al. ...................... 323/288 |
| 2010/0019807 A1 | 1/2010 | Zhang et al. |

FOREIGN PATENT DOCUMENTS

EP 0568279 A1 11/1993

OTHER PUBLICATIONS

R.Kelley et al., "Optimized Gate Driver for Enhancement-mode SiC JFET", www.semisouth.com/application/application.html, Mar. 13, 2009, 6 pp., SemiSouth Laboratories, Inc., Starkville, MS.
R.Kelley et al., "SiC JFET Gate Driver Design for Use in DC/DC Converters", www.semisouth.com/application/application.html, Jan. 20, 2006, 4 pp., SemiSouth Laboratories, Inc., Starkville, MS.
Semisouth, "Two-Stage Opto Coupled Gate Driver Demo Board", SGDR600P1, Feb. 2010, 7 pp., SemiSouth Laboratories, Inc., Starkville, MS.
Semisouth, "Normally-OFF Trench Silicon Carbide Power JFET", SJEP120R100, Jul. 2009, 7 pp., SemiSouth Laboratories, Inc., Starkville, MS.
International Search Report and Written Opinion, Dec. 26, 2011, 12 pages, International Application No. PCT/US2011/035981 filed May 10, 2011.

* cited by examiner

*Primary Examiner* — John Poos
(74) *Attorney, Agent, or Firm* — Holland & Hart LLP

(57) ABSTRACT

A junction device driver is provided that includes a current regulator, an inductor coupled with the current regulator, and a switching module coupled with the inductor. The current regulator is configured to generate a current, and the inductor is configured to store energy generated by the current produced by the current regulator. The switching module is configured to control a conduction current for a gate of a junction device. The conduction current is generated, initially, from the stored energy of the inductor to thereby provide a relatively high initial current. As the energy stored in the inductor is discharged, the current level drops to a lower level that is sufficient to maintain the junction device in an "on" state.

26 Claims, 12 Drawing Sheets

JUNCTION GATE DRIVER WITH TAPPED INDUCTOR CURRENT SOURCE

CROSS REFERENCES

This application claims priority to U.S. Provisional Patent Application No. 61/333,157 entitled "JUNCTION GATE DRIVER," filed on May 10, 2010, the entire disclosure of which is incorporated herein by reference. This application also incorporates by reference U.S. patent application Ser. No. 13/104,656, entitled "JUNCTION GATE DRIVER," filed on May 10, 2011.

BACKGROUND

The present disclosure is directed to circuits in general and, in particular, to current driver circuits for junction devices.

In electrical circuits, the gates of junction devices, such as JFETs or bipolar junction transistors (BJTs), may need to be driven with an increased initial current to cause the junction device to switch quickly. This may be due to various capacitances within the junction device that must be charged before the device will switch. The greater the current supplied to the gate of the junction device, the faster the device's capacitances may be charged, thereby allowing the junction device to switch more quickly than a device having lower current supplied thereto.

While delivering an increased current to the device may allow the junction to switch relatively quickly, such increased current delivery also generally increases the power consumption of the driver circuit. For example, to deliver an increased current to allow a junction to switch relatively quickly, a DC to DC converter may be used. However, delivering a high current from a high voltage source may result in a relatively large amount of power dissipation by the circuit, which would also result in a significant amount of heat generation. Such high power dissipation may result in the driver circuit needing a larger area and may prevent the driver circuit from being mounted in a single integrated circuit package.

SUMMARY

In many applications, relatively fast switching of junctions is desired, such as quickly switching a power JFET. Furthermore, these same applications also have a desire to have low power use. Embodiments described herein provide a new design of a driver for a junction device that may allow for lower power consumption, yet create sufficient initial current to yield fast junction switching times. Methods, systems, and devices are described for a novel gate driver circuit. Aspects of the present disclosure provide a current regulator that used in conjunction with an inductor that is coupled with the gate of a junction device, such as a JFET of BJT. The inductor, may be used to generate a conduction current to drive the junction device to switch on, such as conduction current to drive the gate of a JFET. Such driver circuits may allow for faster and more efficient switching of junction devices.

Therefore, in an embodiment, a current driver apparatus is provided that includes a current regulator, a tapped inductor, and first and second switching modules. The current regulator is configured to generate a current, and the tapped inductor is coupled to the current regulator and configured to receive the current and store energy. The first switching module is coupled to an output of the tapped inductor and configured to control a conduction current for a junction device that is at least partially generated from the stored energy of the inductor. The second switching module is coupled to a tap of the tapped inductor and configured to change the inductance present at the output of the tapped inductor. When the first switching module couples the output of the tapped inductor to the junction device, the second switching module switches the inductance present at the output of the tapped inductor and thereby causes increased current to be provided from the tapped inductor to the junction device.

Such a gate driver thus efficiently provides a relatively high magnitude initial current to enable the junction device to switch relatively quickly with relatively low power consumption. Such a gate driver may not require the use of a DC to DC converter, may consume less power, and/or may also consume less space than other gate driver circuits.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This description provides examples, and is not intended to limit the scope, applicability or configuration of the invention. Rather, the ensuing description will provide those skilled in the art with an enabling description for implementing embodiments of the invention. Various changes may be made in the function and arrangement of elements.

Thus, various embodiments may omit, substitute, or add various procedures or components as appropriate. For instance, it should be appreciated that the methods may be performed in an order different than that described, and that various steps may be added, omitted or combined. Also, aspects and elements described with respect to certain embodiments may be combined in various other embodiments. It should also be appreciated that the following systems, methods, and devices may individually or collectively be components of a larger system, wherein other procedures may take precedence over or otherwise modify their application.

In some embodiments, a current driver may be used to switch a junction device, such as a power transistor. Such power transistors are known, and may include a JFET or bipolar junction transistor (BJT), for example. While embodiments provided herein describe a driver circuit for a JFET or BJT, it will be readily understood that the concepts described are equally applicable to other devices where it may be desirable to provide a relatively high initial current to switch the device to an "on" state, and then provide a lower sustaining current to maintain the device in the on state. As mentioned above, when a junction device is switched between an "off" state and an "on" state, various capacitances of the junction device as well as stray inductances, such as associated with the device lead for example, need to be charged. In various devices, the value of these capacitances and inductances can be significant enough to prevent particularly fast switching of the device. Thus, to switch such devices quickly, an initial increased amount of current may need to be delivered to the gate of the junction device in order to charge various capacitances and inductances of the junction device. Once these capacitances and inductances have been charged, a lower current may be delivered to the gate of the junction device to keep the device "on." While it may be desirable for an increased amount of current to be delivered to the junction device to switch it quickly, it may also be desired that the gate driver's power use and/or size be minimized. Therefore, a novel architecture for a gate driver is described herein.

Figure 1:
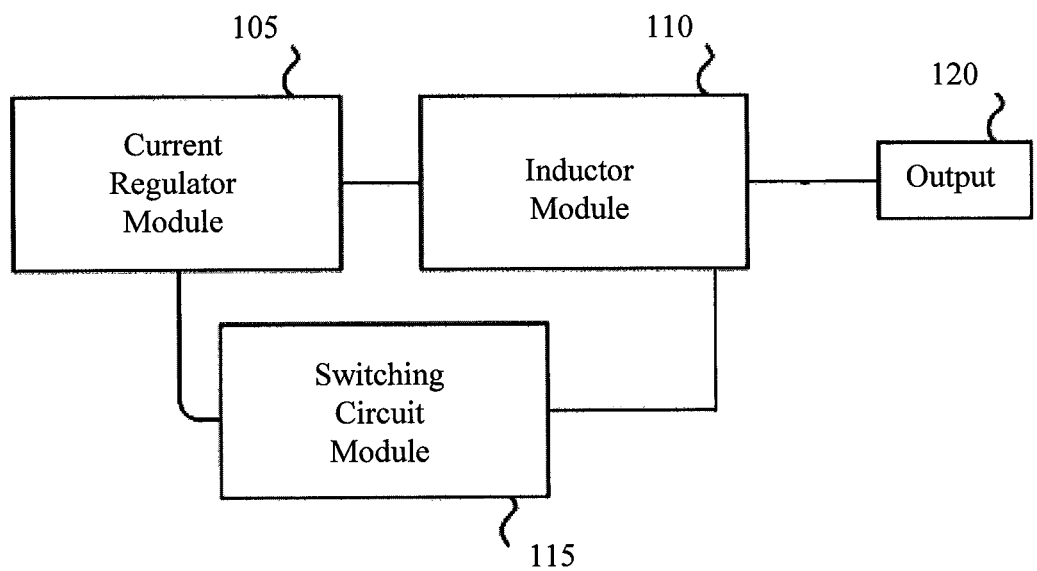
FIG. 1 is a block diagram of a driver circuit including components configured according to various embodiments.

In some embodiments, a gate driver may create an output signal using a current regulator, inductor, and a switching circuit. FIG. 1 illustrates a simplified block diagram of a gate driver 100. Gate driver 100 may include a current regulator module 105, an inductor module 110, and a switching circuit module 115. The current regulator module 105 may include a variety of different current regulators. For example, current regulator module 105 may include a buck circuit with hysteretic feedback. Current regulator module 105 may also include a current source. Such a current regulator may be capable of producing an output current within a defined range. For example, two voltages may be supplied to a current regulator within current regulator module 105, defining the maximum and minimum current desired as an output from current regulator 105. Based on these two signals, current regulator 105 may output a current that stays between the two defined currents or oscillates between the two defined currents. In some embodiments, the current regulator module 105 contains a feedback loop with a comparator. The current regulator module 105, in other embodiments, comprises a comparator with hysteresis coupled to a current sensor that senses current from the inductor. As will be understood by those with skill in the art, there are other ways to create a current regulator that outputs a defined current or outputs a current within a certain range.

The inductor module 110 may include a passive inductor capable of storing energy in a magnetic field created by a current passing through the inductor. While an inductor may allow for instantaneous, or near instantaneous, change in voltage, an inductor resists changes in current. Inductor module 110 may include one a variety of different types inductors, such as an air core or ferromagnetic core coil inductor. The inductor module 110 may also include a tapped inductor that is capable of having inputs selected to provide different inductances that will be present at the input and output of the inductor. Several exemplary embodiments illustrating different inductor configurations will be described in further detail below. The inductor module 110 in the embodiment of FIG. 1 is connected with the output of current regulator module 105. The output of inductor module 110 is provided as the output 120 of gate driver 100. Output 120 may be connected to a gate of a junction device. The junction device being driven by output 140 may be a variety of different forms of junction devices, such as a JFET or a BJT.

Gate driver 100 of the embodiment of FIG. 1 also includes a switching circuit module 115. Switching circuit module 115 may be one or a series of switches or junction devices and drivers. For example, switching circuit module 115 may include a MOSFET that alters a current path of inductor module 110. Switching circuit module 115, in some embodiments, may determine when a current path of inductor module 110 passes through output 120 and passes through to the junction device being driven. When a junction device is not being driven, switching circuit module 115 may enable a current loop such that inductor module 110 may be energized by current regulator module 105. This current loop may have a low resistance, thereby allowing an inductor within inductor module 110 to remain energized with little additional current necessary to be supplied by current regulator module 105. This may translate to less power being consumed by the circuit while a junction device is not being driven. Intermittently, while the junction device is not being driven, current regulator 105 may supply current to the inductor to keep the current at the defined current level or within the defined current range.

When the junction device is to be driven on, switching circuit module 115 alters a current path of inductor module 110. The current flowing through inductor module 110 then passes through to the junction device connected with output 120, thereby resulting in a similar amount of current passing through to the junction device as was passing through the inductor prior to switching circuit module 115 altering the current path of inductor module 110. Such a switch also results in a relatively large swing in the voltage applied to output 120 and to the junction device. Current to drive output 120 and the junction device may also be supplied by current regulator module 105 through inductor module 110. Gradually, the voltage at output 120 and the junction device may decrease. After a time, switching circuit module 115 may be triggered to again alter the current path of inductor module 110, resulting in the initial low-resistance current path of the inductor being created again. The current regulator module 105 continues to energize the inductor (regardless of the state of switching circuit module 115) and maintain a current at a defined level or within a defined range through inductor module 110.

Figure 2:
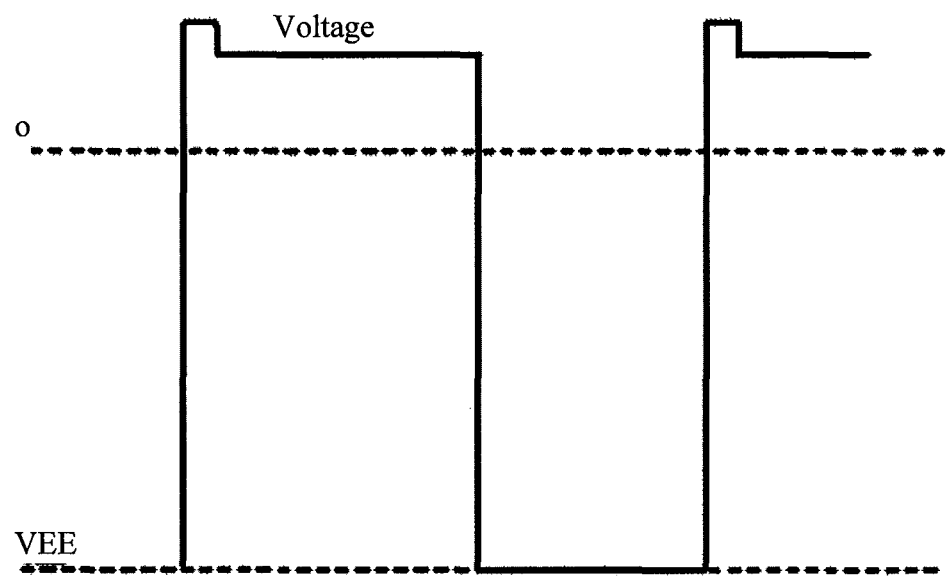
FIG. 2 is diagram of voltage levels at an input to a junction device according to various embodiments.

In order to quickly charge various capacitances or energize various inductances associated with a junction device, such as a JFET, an increased amount of current may be supplied to the gate of the junction device in order to allow it to switch quickly. The lower the amount of current supplied to the gate of the junction device the longer it may take the junction device to switch. FIG. 2 illustrates an idealized graph 200 of gate voltage for a JFET. As illustrated, the JFET's gate is alternated between being driven to various voltages greater than zero or being pulled down to a negative potential VEE. An increased initial voltage is supplied to the gate. This increased voltage may translate to an increased current through the gate, allowing the capacitances of the JFET to be charged relatively quickly. Following the initial higher voltage (and the accompanying higher current) being supplied to the JFET, a lower voltage, and an accompanying lower current, is supplied to keep the JFET turned on. Supplying a lower voltage to the JFET to keep it turned on, as opposed to continuing to supply the higher voltage, results in reduced power consumption and heat dissipation of the JFET and/or driver.

Figure 3:
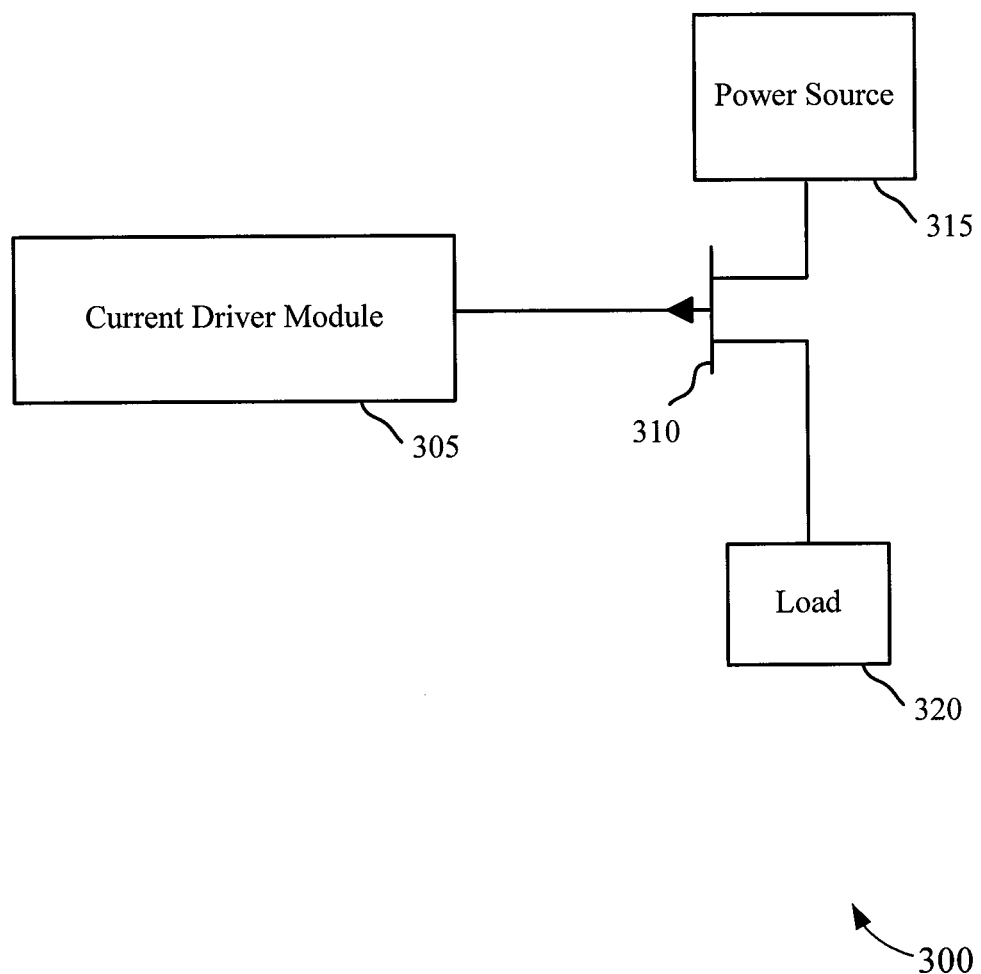
FIG. 3 is a block diagram of a driver circuit coupled to a JFET load according to various embodiments.

With reference now to FIG. 3, an exemplary embodiment is illustrated in which a current driver module such as described above may be implemented. FIG. 3 illustrates a circuit 300 in which current driver module 305 provides current to a gate of a JFET power transistor 310. The power transistor 310 is coupled between a power source 315 and a load 320. Power source 315 may be any of a number of power sources, such as one or more solar panels, for example. Load 320 may be any of a number of loads, such as an inverter configured to transform DC power from one or more solar panels into an AC signal. Power transistor 310 of various embodiments is capable of supplying relatively high currents and voltages, and in one example is capable of providing 20 Amperes of current at between 1,200 and 1,700 Volts. JFET power transistor 310 may be a silicon-carbide based transistor, for example.

In this embodiment, current driver module 305 may include a current regulator module, inductor, and switching circuit similarly as described above with respect to FIG. 1. The current regulator of various embodiments includes a buck circuit with hysteretic feedback for producing an output current within a defined range. The inductor, similarly as described above, may include a passive inductor capable of storing energy in a magnetic field created by a current passing through the inductor. The inductor may also include a tapped inductor that is capable of having inputs selected to provide different inductances that will be present at the input and output of the inductor. The output of the current driver module 305 is coupled to the gate of JFET 310. When a switching module within the current driver module switches the output of the current driver module 305 to the gate of JFET 310, the JFET is driven to turn on, thereby providing current from the power source 315 to the load 320. The current flowing through the inductor of current driver module 305 passes through to the gate of JFET 310, thereby resulting in a similar amount of current passing through to the gate as was passing through the inductor prior to being switched to be coupled to the gate. Gradually, the voltage at the output of the current driver module 305 decreases. As illustrated above, the JFET 310 gate is alternated between being driven to various voltages greater than zero or being pulled down to a negative potential VEE. An increased initial voltage is supplied to the gate. This increased voltage may translate to an increased current through the gate, allowing the capacitances of the JFET 310 to be charged relatively quickly. Following the initial higher voltage (and the accompanying higher current) being supplied to the JFET 310, a lower voltage, and an accompanying lower current, is supplied to keep the JFET 310 turned on. Supplying a lower voltage to the JFET 310 to keep it turned on, as opposed to continuing to supply the higher voltage, results in reduced power consumption and heat dissipation of the JFET 310 and current driver module 305.

Figure 4:
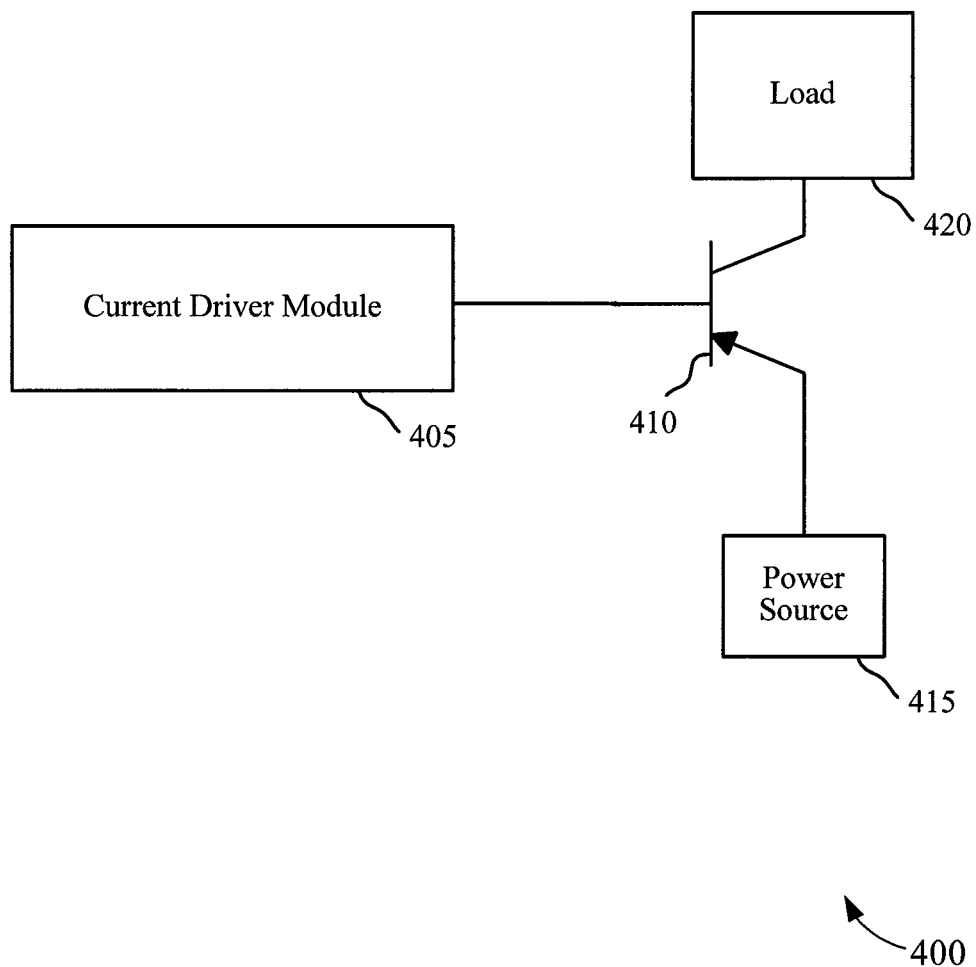
FIG. 4 is a block diagram of a driver circuit coupled to a bipolar junction transistor load according to various embodiments.

With reference now to FIG. 4, another exemplary embodiment is illustrated in which a current driver module such as described above may be implemented. FIG. 4 illustrates a circuit 400 in which current driver module 405 provides current to a gate of a bipolar junction power transistor 410. The power transistor 410 is coupled between a power source 415 and a load 420. Power source 415 may be any of a number of power sources, such as one or more solar panels, for example. Load 420 may be any of a number of loads, such as an inverter configured to transform DC power from one or more solar panels into an AC signal. Power transistor 410 of various embodiments is capable of supplying relatively high currents and voltages, and in one example is capable of providing 20 Amperes of current at between 1,200 and 1,700 Volts. Bipolar junction power transistor 410 may be a silicon-carbide based transistor, for example.

In this embodiment, current driver module 405 may include a current regulator module, inductor, and switching circuit similarly as described above with respect to FIG. 1. The current regulator of various embodiments includes a buck circuit with hysteretic feedback for producing an output current within a defined range. The inductor, similarly as described above, may include a passive inductor capable of storing energy in a magnetic field created by a current passing through the inductor. The inductor may also include a tapped inductor that is capable of having inputs selected to provide different inductances that will be present at the input and output of the inductor. The output of the current driver module 305 is coupled to the base of power transistor 410. When a switching module within the current driver module switches the output of the current driver module 405 to the base of power transistor 410, the power transistor 410 is driven to turn on, thereby providing current from the power source 415 to the load 420. The current flowing through the inductor of current driver module 405 passes through to the base of power transistor 410, thereby resulting in a similar amount of current passing through to the base as was passing through the inductor prior to being switched to be coupled to the base. Gradually, the voltage at the output of the current driver module 405 decreases. As illustrated above, the power transistor 410 base is alternated between being driven to various voltages greater than zero or being pulled down to a negative potential VEE. An increased initial voltage is supplied to the base. This increased voltage may translate to an increased current through the base, allowing the capacitances of the power transistor 410 to be charged relatively quickly. Following the initial higher voltage (and the accompanying higher current) being supplied to the power transistor 410, a lower voltage, and an accompanying lower current, is supplied to keep the power transistor 410 turned on. Supplying a lower voltage to the power transistor 410 to keep it turned on, as opposed to continuing to supply the higher voltage, results in reduced power consumption and heat dissipation of the power transistor 410 and current driver module 405.

Figure 5:
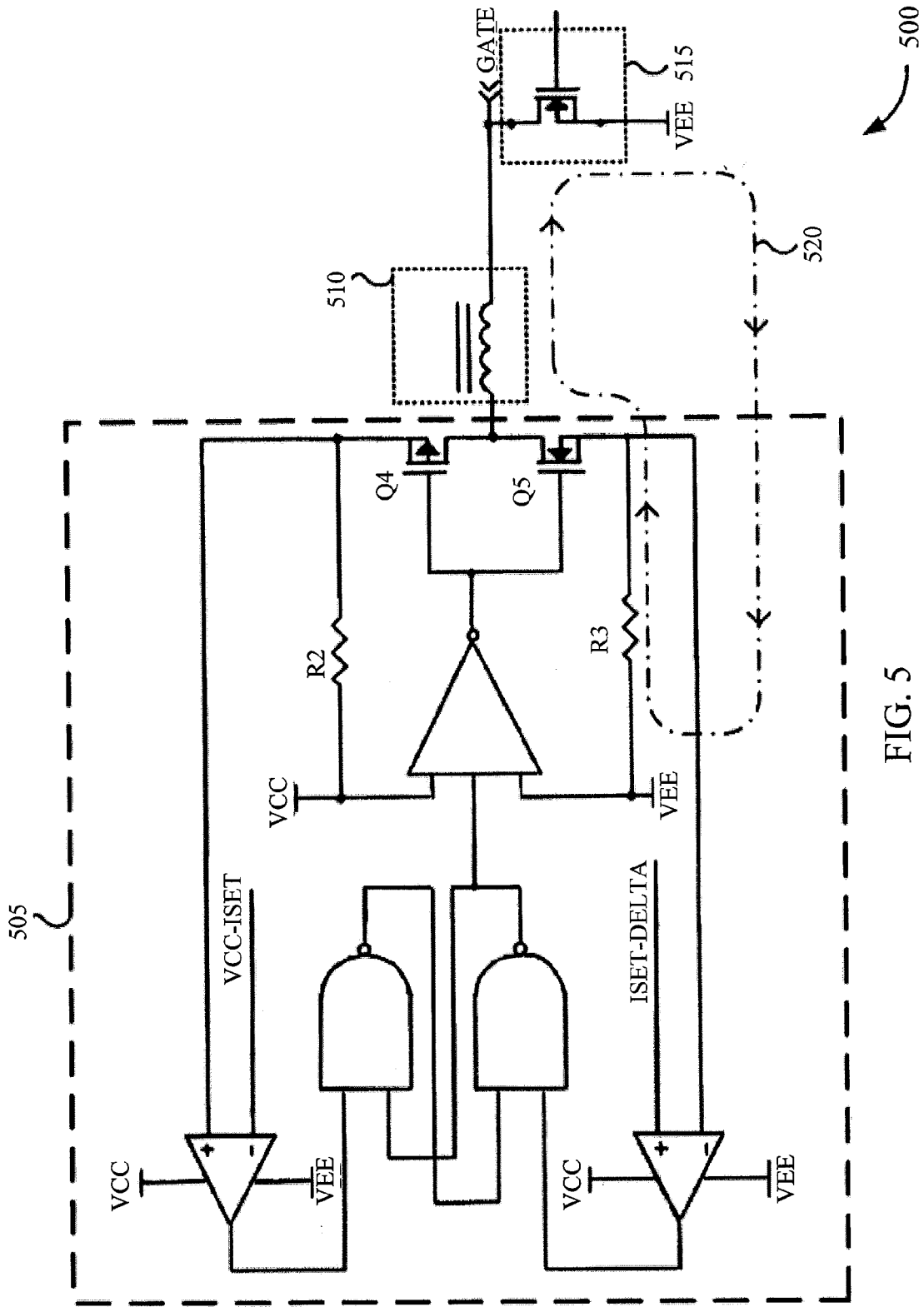
FIG. 5 is a circuit diagram of a current driver circuit according to an embodiment.

In one embodiment, a driver circuit uses a switching circuit, an inductor, and a buck regulator with hysteretic feedback. FIG. 5 illustrates an embodiment of a driver circuit 500 that utilizes such a buck regulator. Driver circuit 500 may represent the same circuit as gate driver 105 of FIG. 1, or may represent some other gate driver. Current regulator module 505 may represent the same current regulator as current regulator module 105 of FIG. 1, or may represent a different current regulator. Current regulator 505 includes a buck regulator with hysteretic feedback. Such a current regulator may receive two signals, illustrated here as "VCC-ISET" and "ISET-DELTA." These two signals may define the maximum and minimum current of the defined current range. Such a buck regulator may employ two comparators and two NAND gates, in the form of a reset-set flip-flop. Depending on the current as measured by the comparators at R2 and R3, either Q4 or Q5 is closed, thereby connecting inductor 510 and maintaining current from the current regulator module 505 within the defined current range.

Inductor 510 may represent an inductor of inductor module 110 of FIG. 1. In the example of FIG. 5, inductor 510 is a 470 µH inductor. In some embodiments, inductor 510 is connected with a diode to prevent current from flowing from the gate of the junction device being driven back to the current regulator.

Inductor 510 is also connected with a switching circuit 515. Switching circuit 515 may be the same switching circuit as switching circuit module 130 of FIG. 1, or may represent some other switching circuit. In FIG. 5, switching circuit is a semiconductor MOSFET device, that determines the current path of inductor 510. In gate driver 500, the MOSFET of switching circuit 515 is used to determine whether the current path of inductor 510 passes through the gate of the connected junction device load or not. When the MOSFET of switching circuit 515 is closed, current path 520 represents the current path of current passing through inductor 510. In such an arrangement, the gate of the connected junction device may be pulled down to VEE. A current may be maintained through inductor 510 by current regulator 505. As the current flowing through inductor 510 decays, current regulator 505 may apply voltage to inductor 510 allowing the current to increase, thereby keeping the current passing through inductor 510 within the range defined for current regulator 505.

When the gate of the MOSFET of the switching device 515 is switched to create an open or off condition, current path 520 is no longer present. Instead, the current passing through inductor 510 passes through to the output of the driver circuit 500, and to the attached junction device (denoted as "gate" in FIG. 5). As known in the art, the current passing through an inductor resists change. This results in a similar current being passed through the gate of the junction device as was present in inductor 510 just before the MOSFET of switching circuit 515 was opened.

Figure 6:
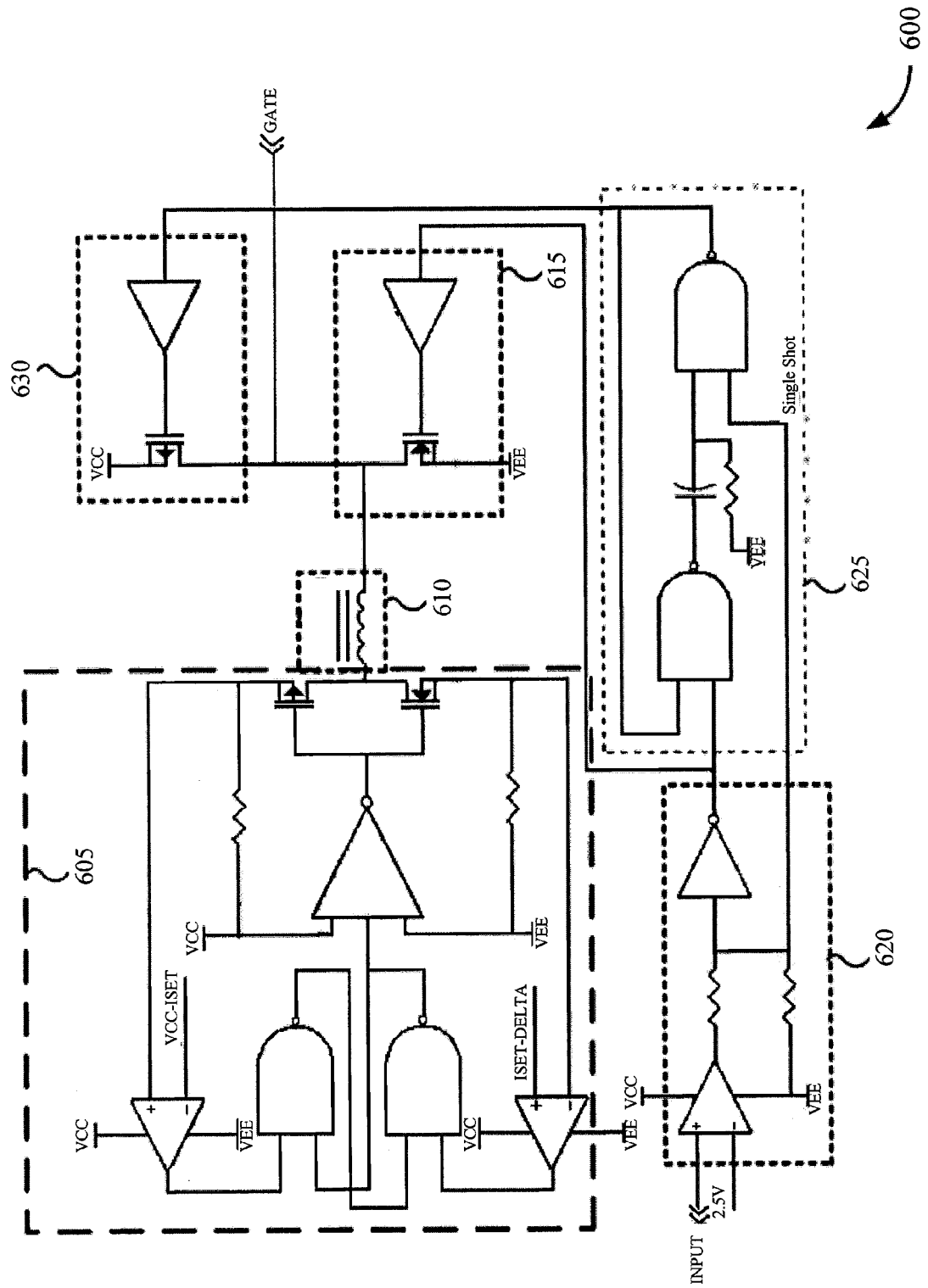
FIG. 6 is a circuit diagram of a current driver circuit and switching module according to an embodiment.

In some embodiments, a driver circuit may contain additional circuitry to allow for an increased current to quickly switch a connected junction device. FIG. 6 illustrates an exemplary driver circuit 600 configured to provide the gate of a junction device, such as a JFET, with an increased current pulse to allow the junction device to switch quickly. The current regulator circuit 605 may be similar to the current regulator circuits of FIGS. 1 and 5 (110 and 505, respectively). Alternatively, a different current regulator circuit may be used. Also, inductor 610 may be the same as inductors 110 and 510 of FIGS. 1 and 5. Again, inductor 610 may also be some other inductor.

Driver circuit 600 contains additional circuitry as compared to the driver circuit 500 of FIG. 5, in the form of a level shift circuit 620 and a single shot circuit 625. Level shift circuit 620 may be used to convert the input signal to the appropriate voltages for the logic of the circuit. In some embodiments, level shift circuit 620 includes a comparator, an inverter, and a pair of resistors to create an output signal with the appropriate logic levels to interact with the logic of single shot circuit 625 and switching circuit 615. As those with skill in the art will recognize, there may be other circuit configurations appropriate to implement a level shift circuit. The input received by level shift circuit 620 may dictate when the gate of the junction device is turned on and off. The input received by level shift circuit 620 may originate in some other circuit, which may be located on the same or some other circuit board as gate driver 600. As those with skill in the art will recognize, the input signal to level shift circuit 620 may be created by a variety of different circuits. Furthermore, level shift circuit 620 may be unnecessary if the logic levels and polarization of the input signal are appropriate for switching circuit 615 and single shot 625.

Single shot circuit 625 is configured to generate a pulse when a trigger is received from level shift circuit 620. This pulse may be of a particular duration, which is determined by its capacitor and resistor values. Thus, the output of the single shot circuit 625 will generate an "on" signal when a signal is provided to the input of the circuit. As the capacitor is charged, which is a function of the capacitance of the capacitor and the value of the associated resistor, the second gate of the signal shot circuit 625 will active thus causing the output of the single shot circuit 625 to turn back "off," thus ending the pulse that is generated by the single shot circuit 625. The duration of the pulse may be selected based on the stray inductance and capacitances associated with the junction device, and the desired switching time. As those with skill in the art will recognize, other embodiments of single shot circuits may be possible. When the single shot circuit 625 creates a pulse, the pulse may trigger a voltage feed circuit 630 to tie the gate of the junction device to VCC. Voltage feed circuit 630 may allow an increased current to be supplied to the gate of the junction device in order to allow the junction device to switch quickly. Voltage feed circuit 630 may include a driver and a switching device, such as a MOSFET. In some embodiments, when the pulse from single shot circuit 625 is received, the driver closes the MOSFET, thereby tying the gate of the junction device to VEE and thereby pull the gate to a negative potential for faster discharging of inductances and capacitances associated with the junction device. Other embodiments of voltage feed circuit 630 may also be possible.

Following an initial pulse of increased current supplied by the voltage feed circuit 630, switching circuit 615, which may behave similarly to the switching circuits of FIGS. 1 and 5, may alter the current path of inductor 615 to drive the junction device to switch on. Here, the switching circuit 615 includes a driver and a MOSFET. When the MOSFET is closed, the inductor has a similar current loop to current loop 520 of FIG. 5: the inductor is charged by the current regulator circuit 605, and kept charged while the current loop through VEE is maintained. When the MOSFET of switching circuit 615 is opened, the current path of inductor 610 is altered such that the current flowing though inductor 610 passes through to the junction device being driven. Current continues to be supplied to inductor 610 from current regulator circuit 605. Therefore, this arrangement allows voltage feed circuit 630 to supply an initial increased pulse of current to the junction device being driven and for inductor 610 to continue to supply a current to the junction device to keep in turned on. When the input signal has again transitions, the switching circuit 615 recreates the original current path for the inductor through VEE thereby allowing the inductor to remain energized, and ties the gate of the junction device being driven to VEE, thereby turning it off.

Figure 7:
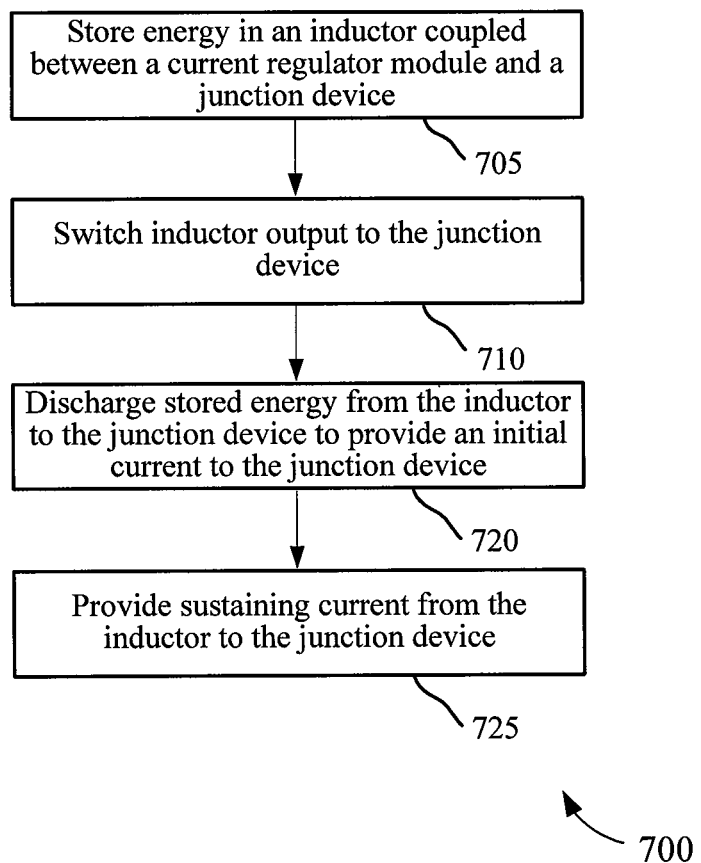
FIG. 7 is a flow chart diagram illustrating the operational steps for providing current to a junction device according to various embodiments.

With reference now to FIG. 7, the operational steps of a method 700 for driving current to a junction device are illustrated. In this embodiment, initially energy is stored in an inductor coupled between a current regulator module and a junction device, as noted at block 705. At block 710, an output of the inductor is switched to the junction device. The stored energy is discharged from the inductor to the junction device to provide an initial current to the junction device, as indicated at block 715. Finally, at block 720, after the inductor is discharged, a sustaining current is provided from the inductor to the junction device.

Figure 8:
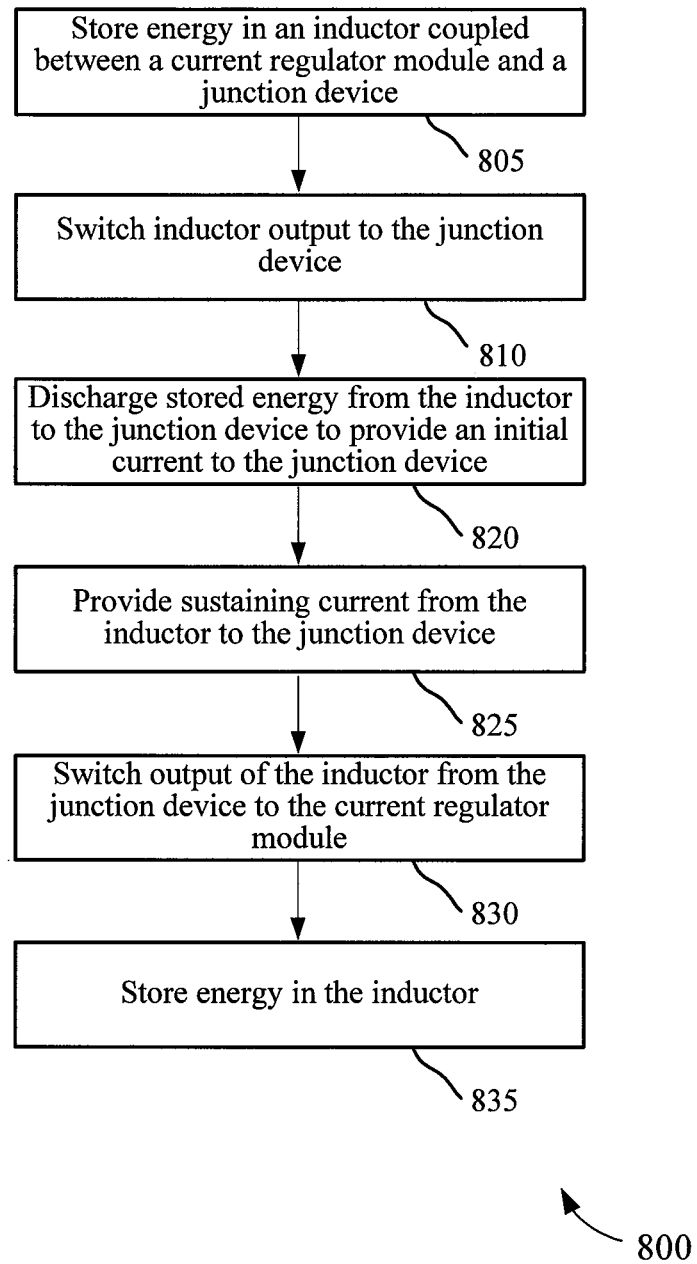
FIG. 8 is a flow chart diagram illustrating the operational steps for providing current to a junction device according to various embodiments.

FIG. 8 illustrates the operational steps of a method 800 of other embodiments for driving current to a junction device. In this method, the operations of blocks 805 through 820 are the same as described with respect to blocks 705 through 720 of FIG. 7. The method of FIG. 8 further includes switching the output of the inductor from the junction device to the current regulator module, as indicated at block 825. With the inductor output switched back to the current regulator, energy is again stored in the inductor, as noted at block 830. In some embodiments, storing energy in the inductor is accomplished through coupling the inductor between the current regulator module and a voltage supply of the current regulator, and maintaining a current through the inductor within a defined range.

The methods 700 and 800 of FIGS. 7 and 8, may be implemented using driver circuit 500 of FIG. 5, or driver circuit 600 of FIG. 6, for example. The inductor of a driver circuit such as described is capable of storing energy in a magnetic field created by a current passing through the inductor. The output of the inductor is coupled to the junction device when a switching module within the current driver switches the output of the current driver to the junction device, which is driven to turn on with an increased initial voltage. Gradually, the voltage at the output of the driver module will decrease. The increased voltage may translate to an increased current through the junction device, allowing the capacitances and/or stray inductances of the device to be charged relatively quickly. Following the initial higher voltage (and the accompanying higher current), a lower voltage, and accompanying lower sustaining current, is supplied to keep the junction device turned on. When the output of the driver circuit is turned off, energy is again stored in the inductor thereby re-energizing the inductor to supply current in the next instance that the output is switched to the junction device.

Figure 9:
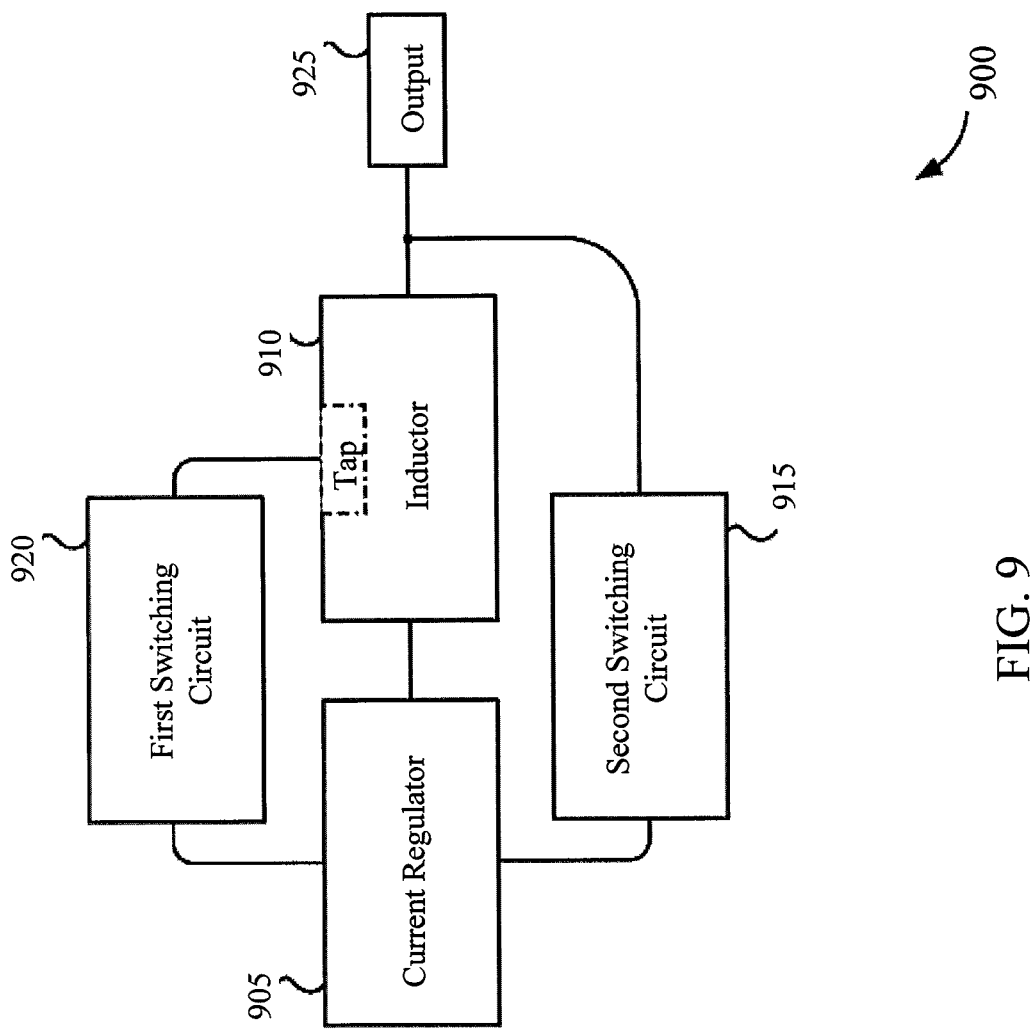
FIG. 9 is a block diagram of a driver circuit utilizing a tapped inductor configured according to various embodiments.

While driver circuit 600 of FIG. 6 produces an increased current pulse to initially drive a junction device to turn on, followed by a lower current to maintain the junction device in the on state, it may be possible to accomplish this without a voltage feed circuit. FIG. 9 illustrates a simplified block diagram of a driver circuit 900 that utilizes a tapped inductor to drive a junction device to switch on with an increased initial current followed by a lower current to maintain the junction device in the on state.

The driver circuit 900 of FIG. 9 includes a current regulator 905, a first switching circuit 915, a second switching circuit 920, and a tapped inductor 910, connected to an output 925, which may be a junction device, such as a JFET. While illustrated as first and second switching circuits 915, 920 in FIG. 9, it will be understood that the functions of both of these switching circuits may be incorporated into a single switching circuit module, such as switching circuit module 115 of FIG. 1. Current regulator 905 may behave similarly to any of the previously described current regulator circuits, such as current regulator circuits 110, 505, and 605 of FIGS. 1, 5, and 6, respectively. For example, current regulator 905 may include a buck regulator with hysteretic control. Alternatively, current regulator 905 may be some other current regulator circuit different from the previously described examples.

Inductor 910 may be an inductor similar to inductors 110, 510, and 610 of FIGS. 1, 5, and 6, respectively. Inductor 910 also includes a tap to allow inductor 910 to be used to create multiple different inductances. For example, the inductor 910 may have a particular inductance when a first and second terminal of the inductor is used in a current path, but have a different inductance when the second and a third terminal, possibly located between the first and second terminals, is used in a current path.

In the embodiment of FIG. 9, first switching circuit 910 is used to alter a current path of inductor 910. A current path may exist though the inductor allowing the current regulator circuit 905 to maintain a near constant current, or a current within a defined range passing through the inductor, similarly as described above. First switching circuit 910 may alter the current path of inductor 910 to pass through to the junction device being driven. Second switching circuit 920 is used to enable inductor 910 to create an increased current signal capable of driving output 920 to quickly charge the various capacitances of a junction device, allowing the junction device to switch relatively quickly. Second switching circuit 920 may also disable current regulator 905 while inductor 910 is delivering the increased current signal to the gate of the junction device being driven. Such a configuration may allow for inductor 910 to create both an initial increased current pulse to turn on the junction device followed by a decreased current signal in order to keep the junction device turned on.

Figure 10:
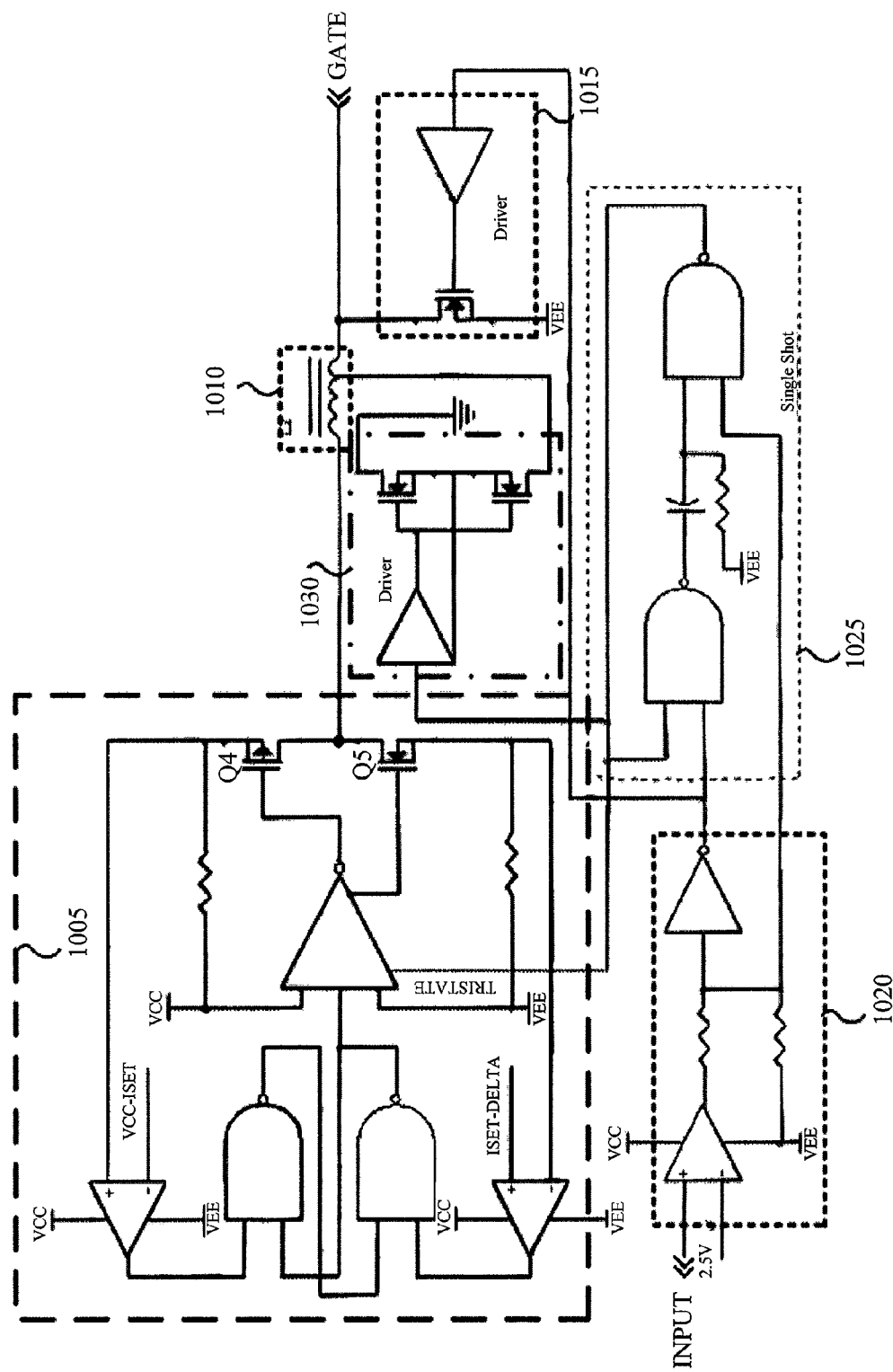
FIG. 10 is a circuit diagram of a current driver circuit utilizing a tapped inductor and switching module according to an embodiment.

An embodiment of a driver circuit 1000 using an inductor to create both the increased current pulse to switch the junction device followed by a decreased current signal to maintain the junction device in the on mode is illustrated in FIG. 10. In this exemplary embodiment, current regulator circuit 1005 receives a signal that determines when the driver of the current regulator circuit 1005 is in tristate mode, and MOSFETs Q4 and Q5 are both open. Level shift circuit 1020 may represent the same level shift circuit as level shift circuit 620 of FIG. 6. Alternatively, level shift circuit 1020 may represent some other form of level shift circuit. Again here, level shift circuit 1020 may be unnecessary if the input signal to the gate driver circuit 1000 is already normalized to the appropriate logical voltage levels. Single shot circuit 1025 may represent the same single shot circuit as single shot circuit 625 of FIG. 6. Alternatively, single shot circuit 1025 may represent some other implementation of a single shot circuit. Similarly as described above, the duration of pulses generated by single shot circuit 1025 may be determined by its resistor and capacitor values.

Inductor 1010 is a tapped inductor having three terminals: a first terminal connected to the current regulator circuit 1005, a second terminal connected to the junction device, and a third terminal that functions as a tap on the inductor 1005. The inductor 1005 may be used in conjunction with three current paths: a first current path through the first and second terminals of inductor 1010 and switching device 1015, a second current path through the first and second terminals of inductor 1010 and the junction device being driven, and a third current path through the second and third terminals of inductor 1010 and the junction device being driven. First switching circuit 1015 contains a driver circuit and a MOSFET, similar to switching circuits previously described. Various other embodiments of switching circuit 1015 may also be used. Second switching circuit 1030 allows for inductor 1010 to create an increased current signal to drive the junction device in order to allow the junction device to switch quickly. To create the increased current pulse, a tap on inductor 1010 is used. Generally, the energy stored in an inductor may be described as:

$$\varepsilon = \frac{1}{2} L i^2$$

In this formula, $\varepsilon$ represents the energy stored by the inductor, i represents the current passing through the inductor, and L represents the inductance, in Henries, of the inductor. Therefore, if the current path of inductor 1010 is altered after the inductor has been energized, the energy stored in the inductor initially remains the same, the inductance of the inductor decreases according to the location of the tap, and the current must consequently increase. Therefore:

$$\frac{1}{2}Li^2 = \frac{1}{2}L_t i_t^2$$

Here, L represents the inductance of the inductor and i represents the current in the inductor before the current path is altered (e.g., through terminals one and two of the inductor). $L_t$ represents the tapped inductor's inductance, and $i_t$ represents the current in the tapped inductor after the current path has been altered (e.g., through terminals two and three of the inductor). Because the energy stored in the inductor before and after the current path has been altered initially remains unchanged, and because the inductance of the tapped inductor is lower than the inductance of the full inductor, the initial current of the tapped inductor must be greater than the current of the inductor before the current path was altered.

With continued reference to FIG. 10, prior to receiving a triggering input at the gate driver circuit's input, the inductor may be energized by current regulator circuit 1005. In this state, first switching circuit 1015 may contain a closed junction (here, a MOSFET), creating a current path through first switching device 1015 similar to current path 520 of FIG. 5. This current path passes through terminals one and two of the inductor, through the junction of first switching device 1015, to VEE, and back to the inductor through current regulator 1005. After some time, the input of gate driver circuit 1000 receives a trigger signal. This trigger signal may be normalized to the appropriate logic levels by level shifting circuit 1020. The output of level shifting circuit 1020, in this example, triggers single shot circuit 1025 to create a pulse of a predetermined duration. The output of level shifting circuit 1020 also causes first switching circuit 1015 to alter the current path of inductor 1010 by opening its junction, thereby breaking the current loop established through terminals one and two of the inductor, through the junction of first switching device 1015, to VEE, and back to the inductor through current regulator 1005.

The pulse created by single shot circuit 1025 also triggers a driver of current regulator circuit 1005 to enter tristate mode. The driver entering tristate mode, in turn, causes the current regulator circuit 1005 switching devices, in this case MOSFETs, that are connected with the driver to both be open. Therefore, terminal one of inductor 1010 remains unconnected, yet the inductor is energized. The pulse created by the single shot circuit 1025 also triggers second switching circuit 1030 to create a current path through the tap of inductor 1010 (e.g., a current path through terminals two and three of inductor 1010). This current path results in an increased current according to the formulas detailed above being driven through to the junction device. Once the pulse created by the single shot circuit 1025 has concluded, the second switching circuit 1030 is opened and the driver of the current regulator 1005 is taken out of tristate mode. This results in the current regulator circuit 1005 supplying current to inductor 1010 and to the gate of the junction device. This current level is less than the current supplied to the gate of the junction device while the current path through the tap on inductor 1010 was active. However, this current is sufficient to maintain the junction device in the on mode. Once the trigger received at the input to the gate driver device 1000 indicates the gate of the junction device should no longer be driven on, the first switching device 1015 is toggled to recreate the current path that passes through terminals one and two of the inductor, through the junction of first switching device 1015, to VEE, and back to the inductor through current regulator 1005 thereby allowing inductor 1010 to be charged by current regulator 1005 and for the gate of the junction device to be pulled to VEE and turned off.

Figure 11:
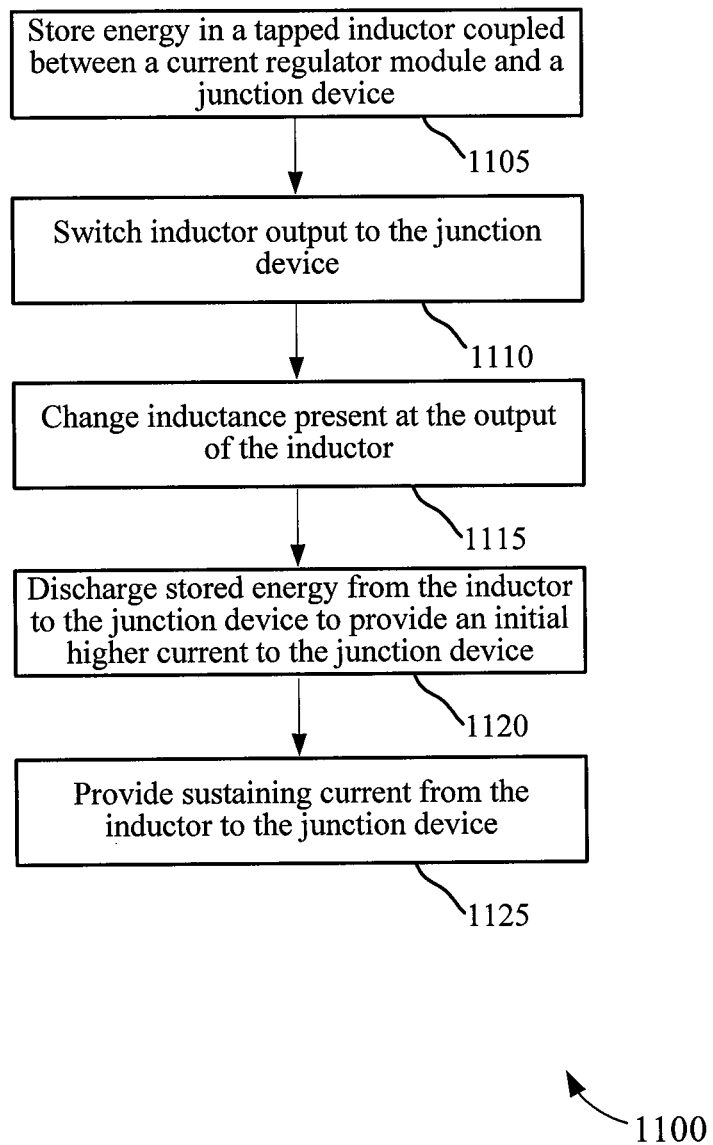
FIG. 11 is a flow chart diagram illustrating the operational steps for providing current to a junction device according to various embodiments.

With reference now to FIG. 11, the operational steps of a method 1100 for driving current to a junction device are illustrated. In this embodiment, initially energy is stored in a tapped inductor coupled between a current regulator module and a junction device, as noted at block 1105. At block 1110, an output of the inductor is switched to the junction device. The inductance present at the output of the inductor is changed, as noted at block 1115. The stored energy is discharged from the inductor to the junction device to provide an initial current to the junction device, as indicated at block 1120. Finally, at block 1125, after the inductor is discharged at the higher current, a sustaining current is provided from the inductor to the junction device.

Figure 12:
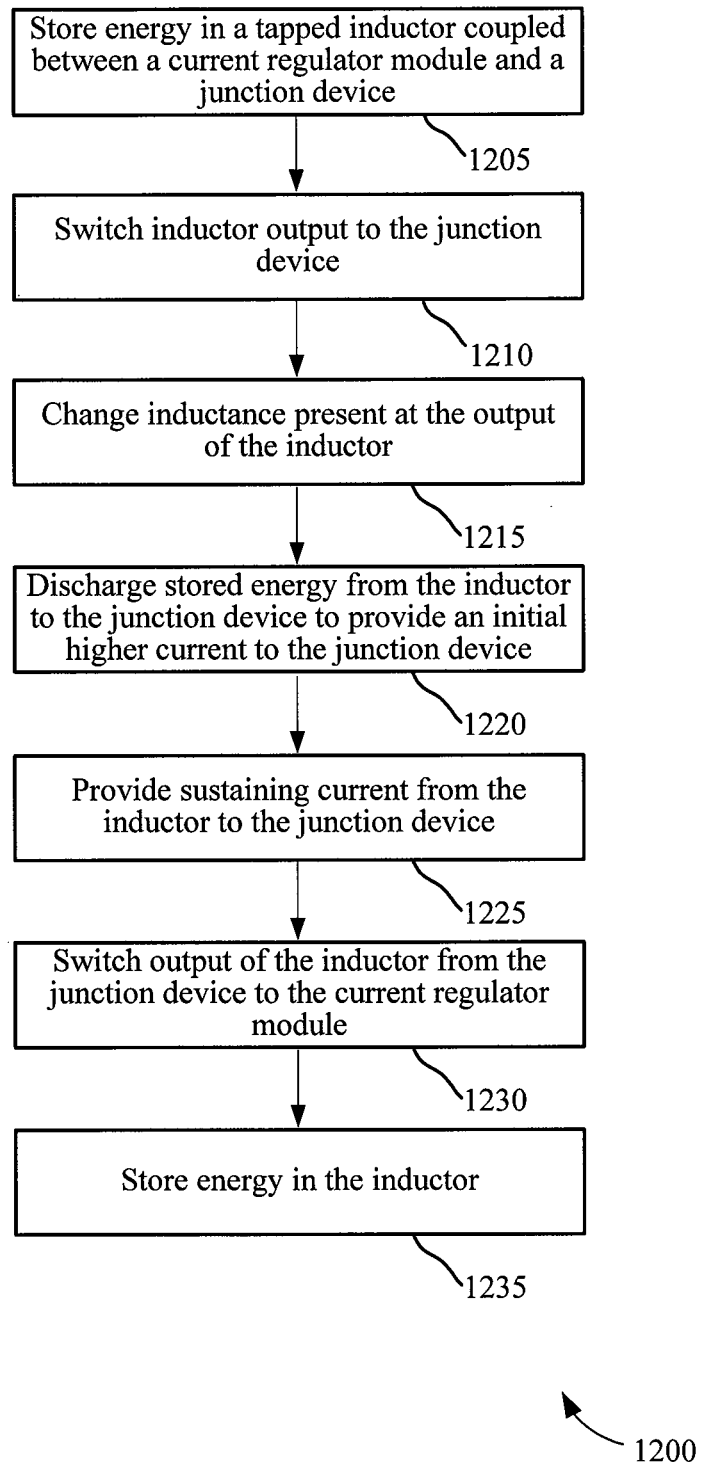
FIG. 12 is another flow chart diagram illustrating the operational steps for providing current to a junction device according to various embodiments.

FIG. 12 illustrates the operational steps of a method 1200 of still further embodiments for driving current to a junction device. In this method, the operations of blocks 1205 through 1225 are the same as described with respect to blocks 1105 through 1125 of FIG. 11. The method of FIG. 12 further includes switching the output of the inductor from the junction device to the current regulator module, as indicated at block 1230. With the inductor output switched back to the current regulator, energy is again stored in the inductor, as noted at block 830. In some embodiments, storing energy in the inductor is accomplished through coupling the inductor between the current regulator module and a voltage supply of the current regulator, and maintaining a current through the inductor within a defined range. The inductance present at the output of the inductor may be changed to allow a relatively lower current to be provided to the inductor to maintain the energy storage at the inductor, and thereby reduce power required to maintain the energy storage at the inductor.

The methods 1100 and 1200 of FIGS. 11 and 12, may be implemented using driver circuit 1000 of FIG. 10, for example. The tapped inductor of a driver circuit such as described is capable of storing energy in a magnetic field created by a current passing through the inductor. The output of the inductor is coupled to the junction device when a switching module within the current driver switches the output of the current driver to the junction device, which is driven to turn on with an increased initial voltage. By altering the inductance utilizing the tap, the voltage to the junction device is further increased without requiring significant additional components or circuitry in the driver circuit. Gradually, the voltage at the output of the driver module will decrease, and the terminals used to couple the inductor again switched to provide a different inductance and thereby provide a sustaining current to the junction device. The initial increased voltage may translate to an increased current through the junction device, allowing the capacitances and/or stray inductances of the device to be charged relatively quickly. Following the initial higher voltage (and the accompanying higher current), a lower voltage, and accompanying lower sustaining current, is supplied to keep the junction device turned on. When the output of the driver circuit is turned off, energy is again stored in the inductor thereby re-energizing the inductor to supply current in the next instance that the output is switched to the junction device. This re-energizing may be accomplished through connection terminals of the tapped inductor that provide a relatively low amount of energy required to energize and sustain the storage in the inductor.

It should be noted that the methods, systems and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A current driver apparatus comprising:
   a current regulator configured to generate a current;
   a tapped inductor comprising an input terminal coupled with the current regulator, an output terminal, and a tap terminal, and configured to receive the current and store energy;
   a first switching module coupled with the output terminal and configured to control a conduction current for a junction device that is provided through the output terminal, wherein the conduction current is at least partially generated from the stored energy of the inductor; and
   a second switching module coupled with the tap terminal and configured to change the inductance present at the output terminal of the tapped inductor.

2. The apparatus of claim 1, wherein the first switching module is further configured to switch the output terminal of the tapped inductor to a voltage supply of the current regulator module and thereby discharge the gate and substantially terminate currents to the junction device.

3. The apparatus of claim 1, wherein the second switching module is configured to change the inductance present at the output terminal of the tapped inductor to a lower inductance when the first switching module initially couples the output terminal of the tapped inductor to the junction device.

4. The apparatus of claim 3, wherein the second switching module is configured to change the inductance present at the output terminal of the tapped inductor to a higher inductance after the first switching module couples the output terminal of the tapped inductor to the junction device.

5. The apparatus of claim 1, wherein the first and second switching modules are configured to maintain a current through the inductor that is lower than the conduction current when the output terminal of the inductor is not coupled to the junction device.

6. The apparatus of claim 1, wherein the first switching circuit module is further configured to bias the junction device to a negative potential.

7. The apparatus of claim 1, wherein the junction device is a JFET.

8. The apparatus of claim 1, wherein the junction device is a bipolar junction transistor.

9. A gate driver apparatus comprising:
   a current regulator module configured to generate a current;
   an inductor, coupled to the current regulator module and configured to receive current from the current regulator module and store energy generated from the received current; and
   a switching module, coupled to the inductor, and configured to (i) switch an output terminal of the inductor to be coupled to a junction device and (ii) switch an inductance present at the output terminal of the inductor utilizing a tap terminal on the inductor,
   wherein the inductor is configured to provide a first current to the junction device through the output terminal that is greater than the current generated by the current regulator module, and to provide a second current to the junction device through the output terminal that is smaller in magnitude than the first current, and wherein the first current is at least partially generated from the stored energy of the inductor.

10. The apparatus of claim 9, wherein the switching module is further configured to switch the output terminal of the inductor to a voltage supply of the current regulator module and thereby discharge the junction device and substantially terminate currents to the junction device.

11. The apparatus of claim 9, wherein the switching module switches the output terminal of the inductor to the junction device when energy generated from the current is stored in the inductor.

12. The apparatus of claim 9, wherein the current regulator module generates current within a defined range.

13. The apparatus of claim 9, wherein the current regulator module comprises a pair of comparators configured to receive a first input voltage and a second input voltage, wherein the first voltage and the second voltage are used to define the maximum and minimum current of the defined current range of the current regulator module.

14. The apparatus of claim 9, wherein the current regulator module comprises a comparator with hysteresis coupled to a current sensor that senses current from the inductor.

15. The apparatus of claim 9, wherein the switching module comprises a connection to a voltage supply.

16. The apparatus of claim 9, wherein the junction device is a JFET.

17. The apparatus of claim 9, further comprising a level shift circuit module coupled with the gate of the device, configured to pass current to the junction device that is greater than the current of the current regulator.

18. A method for driving current to a junction device, comprising:

storing energy in a tapped inductor coupled between a current regulator module and a junction device;

switching an output terminal of the inductor to the junction device;

switching a tap terminal of the tapped inductor to change an inductance present at the output terminal of the inductor;

discharging the stored energy from the inductor to the junction device through the output terminal to provide an initial current to the junction device; and after the discharging, providing a sustaining current from the inductor to the junction device through the output terminal.

19. The method of claim 18, further comprising:

switching the output terminal of the inductor from the junction device to a voltage supply of the current regulator module; and secondly storing energy in the inductor.

20. The method of claim 18, wherein the providing a sustaining current comprises:

changing an inductance present at the output of the inductor, and maintaining a current through the inductor within a defined range.

21. The method of claim 18, wherein the junction device comprises one or more of a JFET and a bipolar junction transistor.

22. The method of claim 18, wherein the storing comprises:

coupling the inductor between the current regulator module and a voltage supply of the current regulator;

maintaining a current through the inductor within a defined range.

23. The method of claim 18, wherein the current regulator module generates current within a defined range.

24. The method of claim 18, wherein the current regulator module comprises a pair of comparators configured to receive a first input voltage and a second input voltage, wherein the first voltage and the second voltage are used to define the maximum and minimum current of the defined current range of the current regulator module.

25. The method of claim 18, further comprising shifting a voltage level that is present at the junction of the device.

26. The method of claim 18, wherein while discharging the stored energy, the current regulator module is switched to provide substantially no current output.

* * * * *